(12) United States Patent
Cheng et al.

(10) Patent No.: US 7,375,413 B2
(45) Date of Patent: May 20, 2008

(54) TRENCH WIDENING WITHOUT MERGING

(75) Inventors: Kangguo Cheng, Beacon, NY (US);
Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 11/420,527

(22) Filed: May 26, 2006

(65) Prior Publication Data

US 2007/0273000 A1 Nov. 29, 2007

(51) Int. Cl.
*H01L 29/00* (2006.01)

(52) U.S. Cl. ............ 257/534; 438/386; 257/E29.004

(58) Field of Classification Search ........ 257/499–535, 257/E29.004; 438/386–392
See application file for complete search history.

(56) References Cited

U.S. PATENT DOCUMENTS

| | | | |
|---|---|---|---|
| 5,059,544 A * | 10/1991 | Burghartz et al. .......... 438/341 |
| 5,323,053 A * | 6/1994 | Luryi et al. ................. 257/485 |
| 5,849,638 A | 12/1998 | Ho et al. |
| 5,891,807 A | 4/1999 | Muller et al. |
| 6,018,174 A | 1/2000 | Schrems et al. |
| 6,153,474 A | 11/2000 | Ho et al. |
| 6,190,988 B1 | 2/2001 | Furukawa et al. |
| 6,232,171 B1 | 5/2001 | Mei |
| 6,306,772 B1 | 10/2001 | Lin et al. |
| 6,365,485 B1 | 4/2002 | Shiao et al. |
| 6,403,412 B1 | 6/2002 | Economikos et al. |
| 6,440,792 B1 | 8/2002 | Shiao et al. |
| 6,495,411 B1 | 12/2002 | Mei |
| 6,495,883 B2 * | 12/2002 | Shibata et al. ............... 257/331 |
| 6,605,860 B1 * | 8/2003 | Tews et al. .................. 257/618 |
| 6,696,344 B1 | 2/2004 | Lin et al. |
| 6,713,341 B2 | 3/2004 | Chen et al. |
| 6,716,696 B2 | 4/2004 | Chen et al. |
| 6,716,757 B2 | 4/2004 | Lin et al. |
| 6,767,786 B1 | 7/2004 | Lin et al. |
| 6,770,563 B2 | 8/2004 | Huang et al. |
| 6,800,535 B1 | 10/2004 | Tsai et al. |
| 6,815,356 B2 | 11/2004 | Tsai et al. |
| 7,129,129 B2 * | 10/2006 | Adam et al. ................. 438/242 |
| 2005/0212027 A1 | 9/2005 | Adam et al. |
| 2005/0215007 A1 | 9/2005 | Cheng et al. |

FOREIGN PATENT DOCUMENTS

WO    WO0124246 A1    4/2001

* cited by examiner

*Primary Examiner*—Zandra V. Smith
*Assistant Examiner*—Paul E Patton
(74) *Attorney, Agent, or Firm*—Schmeiser, Olsen & Watts; Steven Capella

(57) ABSTRACT

A semiconductor fabrication method comprises steps of providing a semiconductor structure. The semiconductor structure includes a semiconductor substrate, a trench in the semiconductor substrate. The trench comprises a side wall which includes {100} side wall surfaces and {110} side wall surfaces. The semiconductor structure further includes a blocking layer on the {100} side wall surfaces and the {110} side wall surfaces. The method further comprises the steps of removing portions of the blocking layer on the {110} side wall surfaces without removing portions of the blocking layer on the {100} side wall surfaces such that the {110} side wall surfaces are exposed to a surrounding ambient.

7 Claims, 9 Drawing Sheets

TRENCH WIDENING WITHOUT MERGING

BACKGROUND OF THE INVENTION

1. Technical Field

The present invention relates to trenches for forming capacitors, and more specifically, to trench widening technologies.

2. Related Art

In the prior art, a capacitor can be formed by first forming a trench in a semiconductor substrate. In order to increase the capacitance of the capacitor, the trench can be widened. However, there is a risk of merging neighboring trenches during the widening process. Therefore, there is a need for a trench structure (and a method for forming the same), in which trench widening does not result in trench merging.

SUMMARY OF THE INVENTION

The present invention provides a semiconductor structure, comprising (a) a semiconductor substrate; (b) a trench in the semiconductor substrate, wherein the trench comprises a side wall, and wherein the side wall comprises {100} side wall surfaces and {110} side wall surfaces; and (c) blocking regions on the {100} side wall surfaces and not on the {110} side wall surfaces.

The present invention provides a semiconductor fabrication method, comprising providing a semiconductor structure which includes: (a) a semiconductor substrate, (b) a trench in the semiconductor substrate, wherein the trench comprises a side wall, and wherein the side wall comprises {100} side wall surfaces and {110} side wall surfaces, and (c) a blocking layer on the {100} side wall surfaces and the {110} side wall surfaces of the trench; and removing portions of the blocking layer on the {110} side wall surfaces without removing portions of the blocking layer on the {100} side wall surfaces such that the {110} side wall surfaces are exposed to a surrounding ambient.

The present invention provides a semiconductor fabrication method, comprising providing a semiconductor structure which includes: (a) a semiconductor substrate, and (b) a first trench in the semiconductor substrate; and expanding the first trench in first directions but not in second directions different from the first directions.

The present invention provides a semiconductor structure, comprising: (a) a semiconductor substrate which comprises a first semiconductor material; (b) an electrically conducting region in the semiconductor substrate; (c) a capacitor dielectric layer (i) sandwiched between, (ii) in direct physical contact with, and (iii) electrically insulating the electrically conducting region and the semiconductor substrate; (d) a semiconductor blocking region (i) sandwiched between and (ii) in direct physical contact with the capacitor dielectric layer and the semiconductor substrate, wherein the semiconductor blocking region comprises a second semiconductor material different from the first semiconductor material.

The present invention provides a trench structure (and a method for forming the same), in which trench widening does not result in trench merging.

DETAILED DESCRIPTION OF THE INVENTION

Figure 1A:
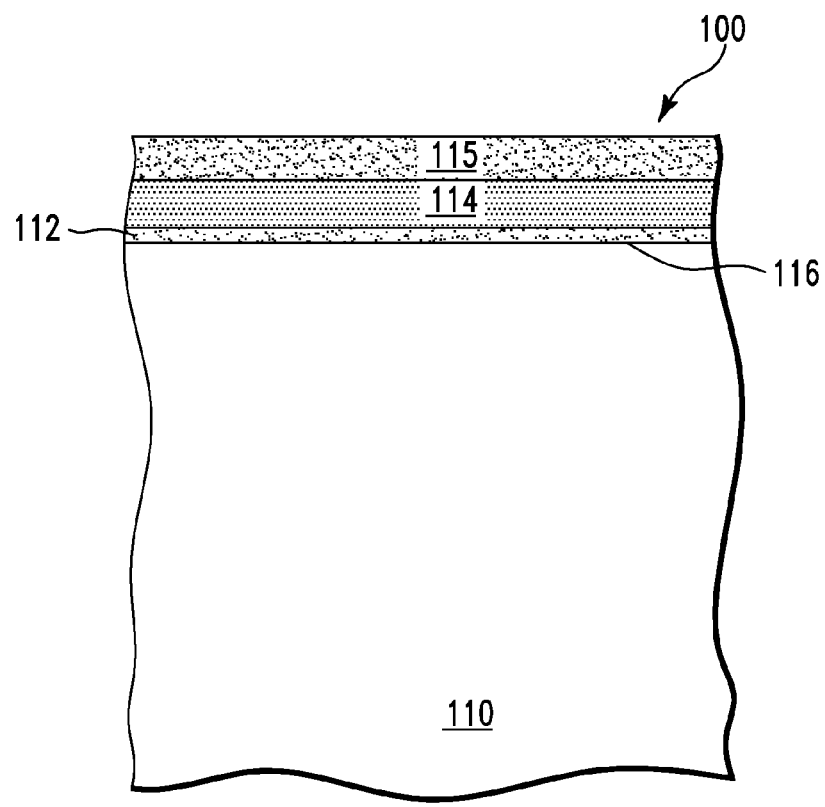
FIGS. 1A-1Ia illustrate a first fabrication method for forming a first semiconductor structure, in accordance with embodiments of the present invention.

FIGS. 1A-1I illustrate a fabrication method for forming a semiconductor structure 100, in accordance with embodiments of the present invention. More specifically, with reference to FIG. 1A, in one embodiment, the fabrication of the semiconductor structure 100 starts out with a semiconductor substrate 110. Illustratively, the semiconductor substrate 110 comprises a semiconductor material such as silicon (Si), germanium (Ge), silicon germanium (SiGe), silicon carbide (SiC), and those materials consisting essentially of one or more compound semiconductors such as gallium arsenic (GaAs), gallium nitride (GaN), and indium phosphoride (InP), etc. Alternatively, the substrate 110 has a semiconductor-on-insulator type structure, e.g., a silicon-on-insulator (SOI) substrate.

Next, in one embodiment, a pad oxide layer 112 is formed on top of the semiconductor substrate 110. More specifically, the pad oxide layer 112 can be formed by thermally oxidizing a top surface 116 of the semiconductor substrate 110.

Next, in one embodiment, a pad nitride layer 114 is formed on top of the pad oxide layer 112. More specifically, the pad nitride layer 114 can be formed by CVD (Chemical Vapor Deposition) of silicon nitride on top of the pad oxide layer 112.

Next, in one embodiment, a hard mask layer 115 is formed on top of the pad nitride layer 114. In one embodiment, the hard mask layer 115 can be formed by CVD (Chemical Vapor Deposition) of silicon oxide on top of the pad nitride layer 114.

Figure 1B:
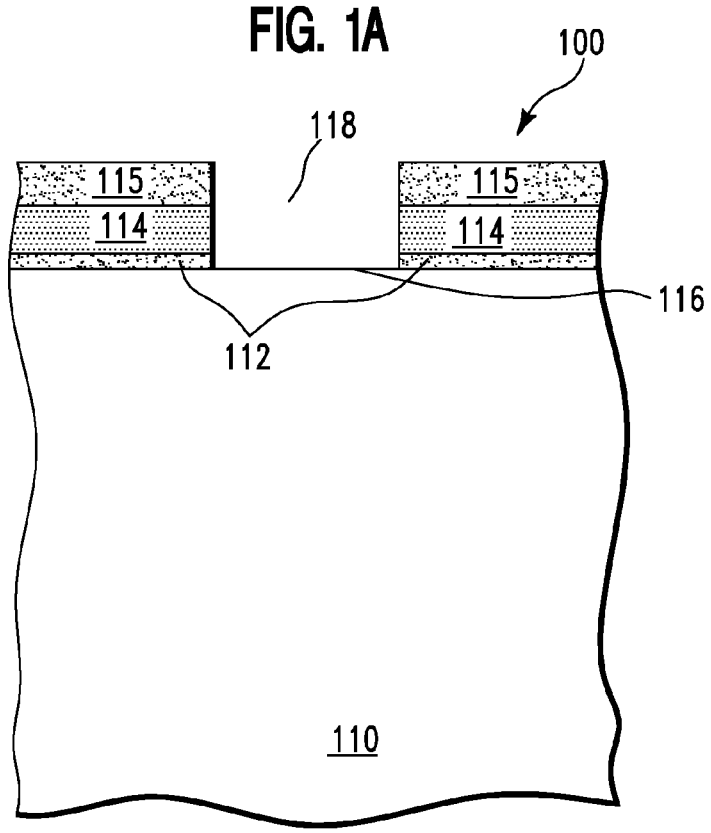

Next, with reference to FIG. 1B, in one embodiment, an opening 118 is created by, illustratively, patterning and etching through the hard mask layer 115, the pad nitride layer 114, and the pad oxide layer 112 until the top surface 116 of the semiconductor substrate 110 is exposed to a surrounding ambient. In one embodiment, the step of etching through the hard mask layer 115, the pad nitride layer 114, and the pad oxide layer 112 to form the opening 118 can involve photo-lithography and then RIE (Reactive Ion Etching) etching.

Figure 1C:
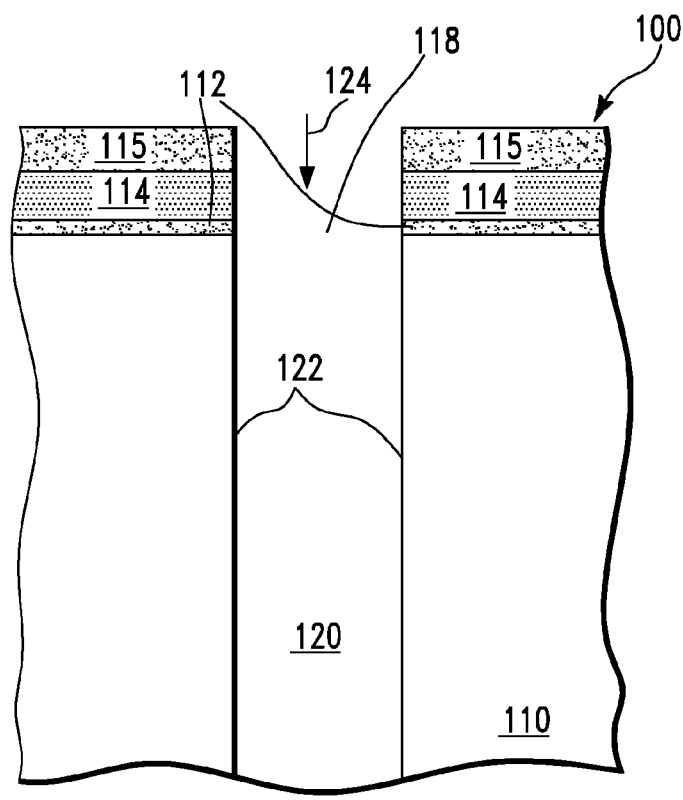

Next, in one embodiment, the hard mask layer 115 is used as a mask for anisotropically etching the semiconductor substrate 110 via the opening 118, resulting in a trench 120 of FIG. 1C. This etching step is represented by an arrow 124 and hereafter is referred to as an etching step 124. In one embodiment, the etching step 124 is RIE etching. Next, in one embodiment, the hard mask layer 115 can be stripped in any suitable process after forming the trench 120.

Figure 1D:
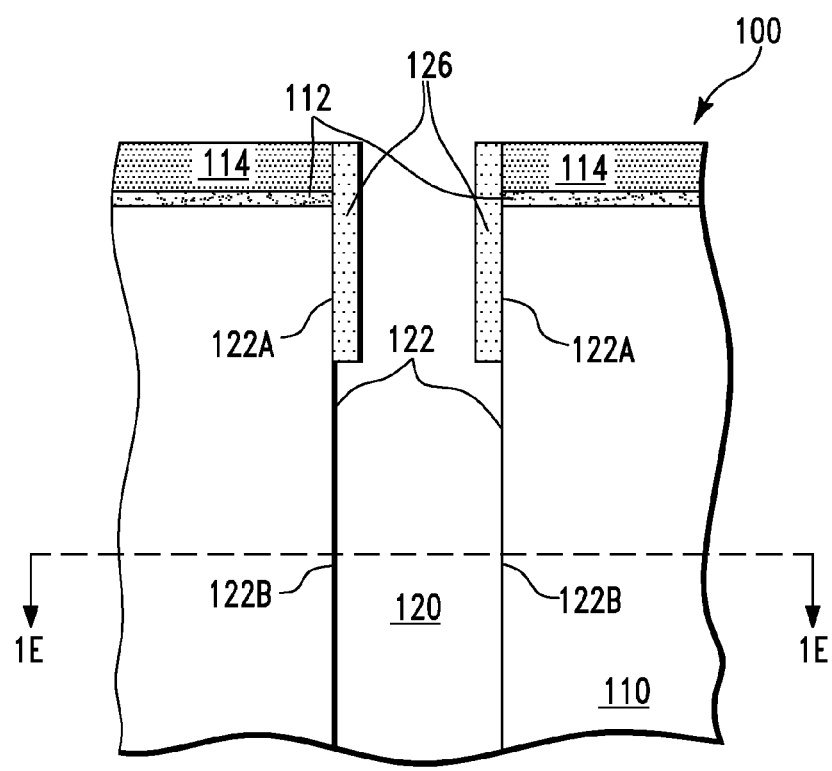

With reference to FIG. 1D, in one embodiment, a collar protection layer 126 is formed on a top sidewall portion 122A of the side wall 122 of the trench 120. The collar protection layer 126 is typically made of oxide, nitride, or any suitable dielectric material. In one embodiment, the collar protection layer 126 is formed by performing a first trench etch to partially etching the trench to a predetermined depth, forming collar protection layer 126 on trench sidewall, and then performing a second trench etch to etch the trench to a desired depth. In another embodiment, the collar protection layer 126 is formed after the entire trench is formed. Methods for forming a collar in the upper trench are well known in the art and therefore are not described in details in order to avoid obscuring the invention.

Figure 1E:
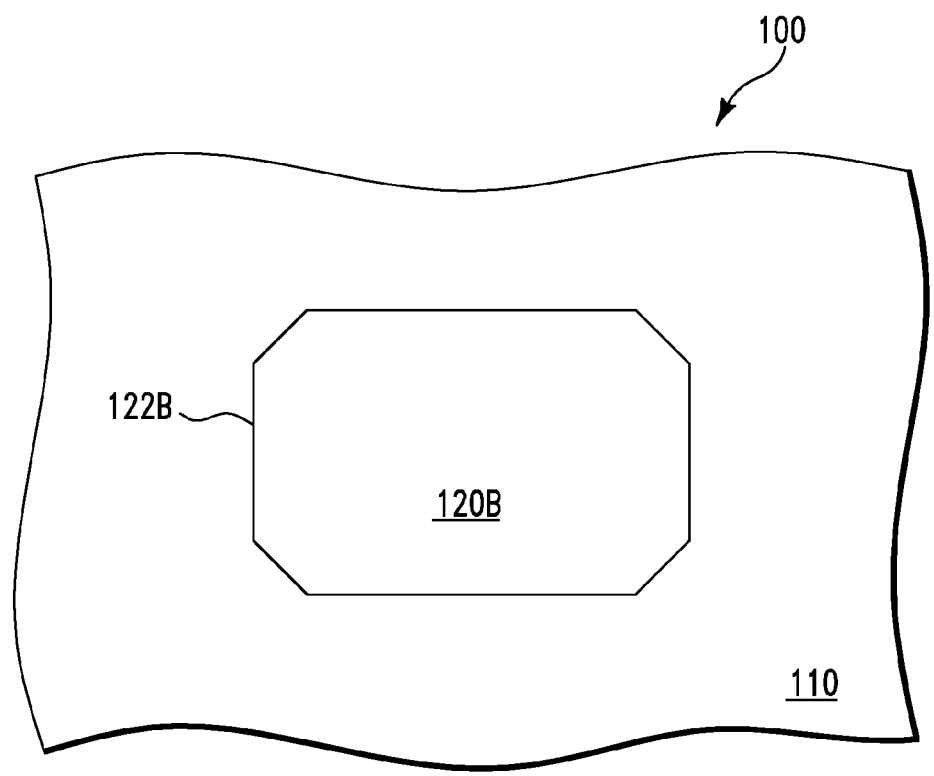

FIG. 1E illustrates a cross-section view along a line 1E-1E of the structure 100 of FIG. 1D. In one embodiment, a horizontal cross-section of the side wall 122 of the trench 120 has a shape of an octagon as shown in FIG. 1E. It is should be noted that hereafter, only the bottom sidewall portion 122B of bottom trench portion 120B is shown in FIGS. 1E-1Ia.

In general, the horizontal cross-section of the side wall 122 of the trench 120 can have any shape. It should be noted that the shape of the cross-section of the side wall 122 of the trench 120 depends on a shape of the opening 118 (in FIG. 1B).

Figure 1F:
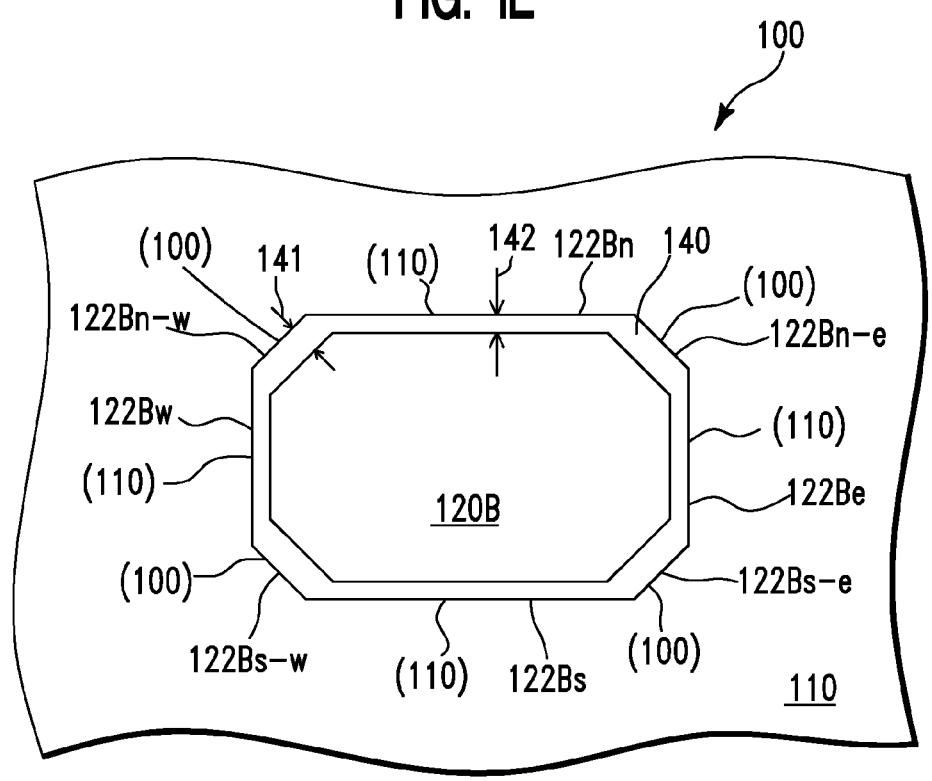

Next, with reference to FIG. 1F, in one embodiment, a blocking layer 140 whose material is different from the material of the substrate 110 is epitaxially grown on the side wall portion 122B of the bottom trench portion 120B. In one embodiment, the substrate 110 is silicon and the blocking layer 140 is SiGe (silicon-germanium). Alternatively, the epitaxial grown material 140 can be germanium (Ge), silicon carbide (SiC), and those materials consisting essentially of one or more compound semiconductors such as gallium arsenic (GaAs), gallium nitride (GaN), and indium phosphoride (InP), etc. Assume that, the Si material of the substrate 110 at side wall surfaces 122Be (122B east), 122Bw (122B west), 122Bn (122B north), and 122Bs (122B south) have a lattice (crystallographic) orientation of $\{110\}$. Assume further that, the Si material of the substrate 110 at side wall surfaces 122Bn-e (122B north-east), 122Bn-w (122B north-west), 122Bs-e (122B south-east), and 122Bs-w (122B south-west) have a lattice orientation of $\{100\}$. Due to the fact that the epitaxial growth rate is dependent on the crystallographic orientations, the SiGe blocking layer 140 is thicker on the $\{100\}$ side wall surfaces 122Bn-e, 122Bn-w, 122Bs-e, and 122Bs-w than on the $\{110\}$ side wall surfaces 122Be, 122Bw, 122Bn, and 122Bs after the epitaxial growth. For instance, a thickness 141 of the SiGe blocking layer 140 on the $\{100\}$ side wall surface 122Bn-w is greater than a thickness 142 of the SiGe blocking layer 140 on the $\{110\}$ side wall surface 122Bn.

In one embodiment, the SiGe layer 140 may be deposited or grown using conventional techniques such as chemical vapor deposition methods. For example, ultrahigh vacuum chemical vapor deposition (UHVCVD) may be used. Other conventional techniques include rapid thermal chemical vapor deposition (RTCVD), low-pressure chemical vapor deposition (LPCVD), limited reaction processing CVD (LRPCVD) and molecular beam epitaxy (MBE). The atomic ratio between germanium and silicon (Ge:Si) in the SiGe layer 140 may preferably range from 1:99 to 99:1, more preferably from 1:4 to 4:1, and most preferably from 1:2 to 2:1. In one embodiment, the atomic ratio between germanium and silicon in the SiGe is 2:3. The thickness of SiGe is greater on the $\{100\}$ surfaces than on the $\{110\}$ surfaces. For example, about 300 angstroms of SiGe may be formed on those $\{100\}$ side wall surfaces and about 60 angstroms of SiGe may be formed on those $\{110\}$ side wall surfaces.

Next, in one embodiment, portions of the SiGe blocking layer 140 are removed by using an etching step. The etching process is performed until the $\{110\}$ side wall surfaces 122Be, 122Bw, 122Bn, and 122Bs are exposed to the surrounding ambient. Since the SiGe blocking layer 140 is thicker on the $\{100\}$ side wall surfaces 122Bn-e, 122Bn-w, 122Bs-e, and 122Bs-w than on the $\{110\}$ side wall surfaces 122Be, 122Bw, 122Bn, and 122Bs (in FIG. 1F) before etching, a portion of SiGe remains on each $\{100\}$ side wall surface after etching, forming SiGe blocking regions 140a, 140b, 140c, and 140d on the four $\{100\}$ side wall surfaces 122Bn-e, 122Bs-e, 122Bs-w, and 122Bn-w, respectively, as shown in the structure 100 of FIG. 1G. In one embodiment, the etching step is a wet etching process with an etchant containing ammonia-based chemistry. Alternatively, the etching step is a dry etching process such as plasma etch.

Figure 1G:
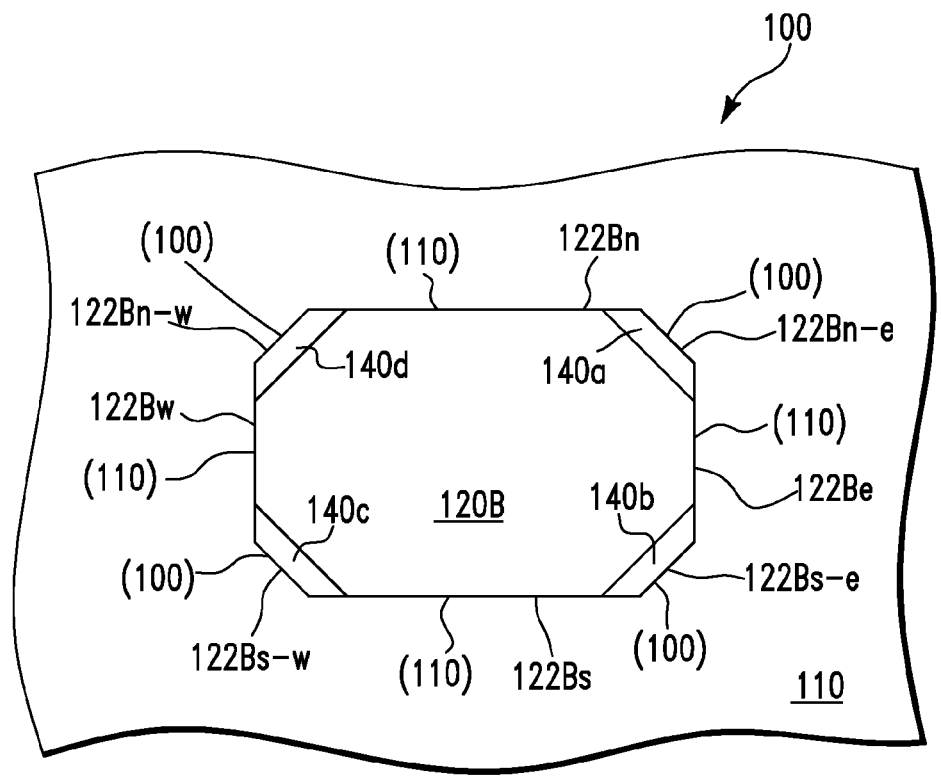
Figure 1H:
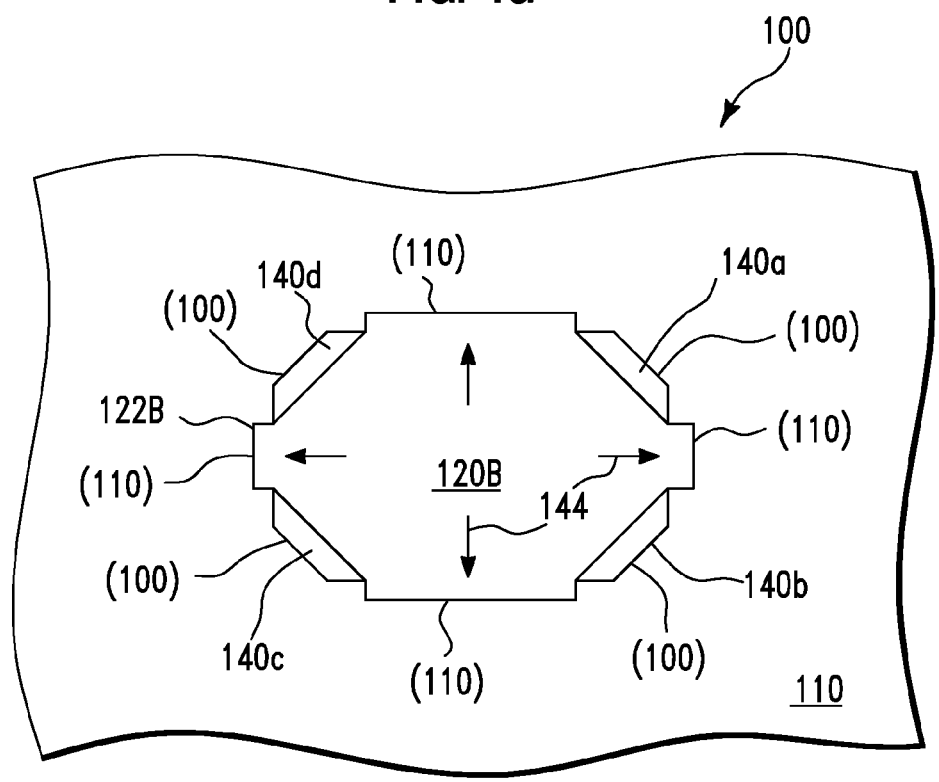
Figure 1H:
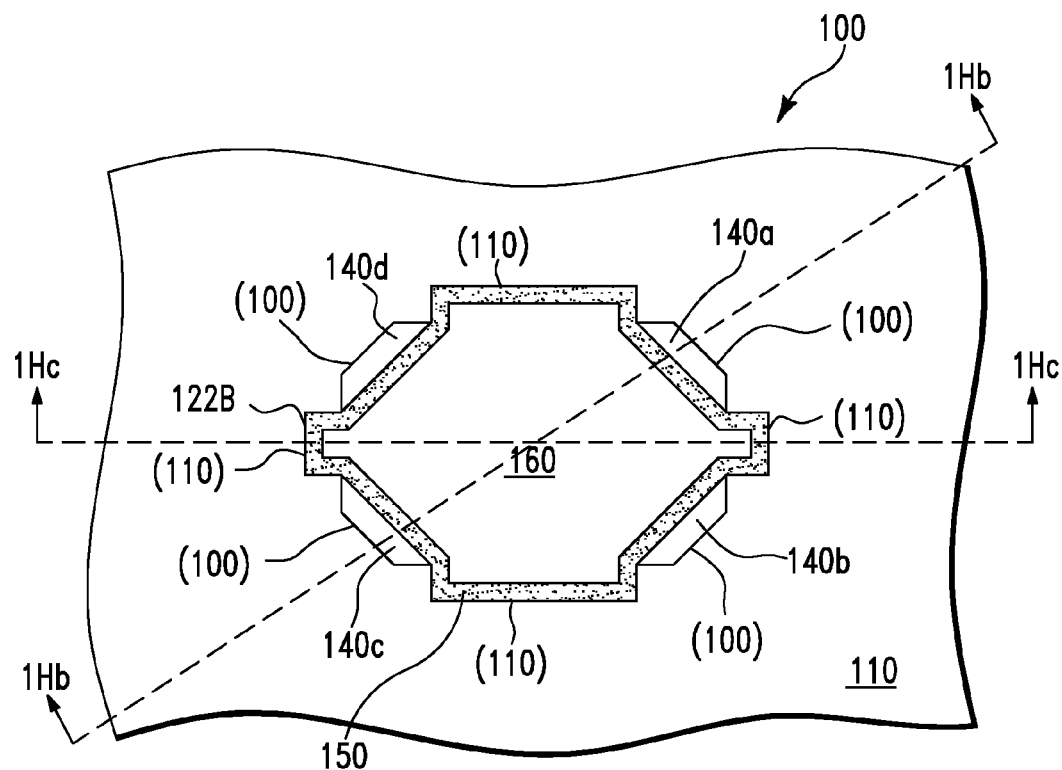
Figure 1H:
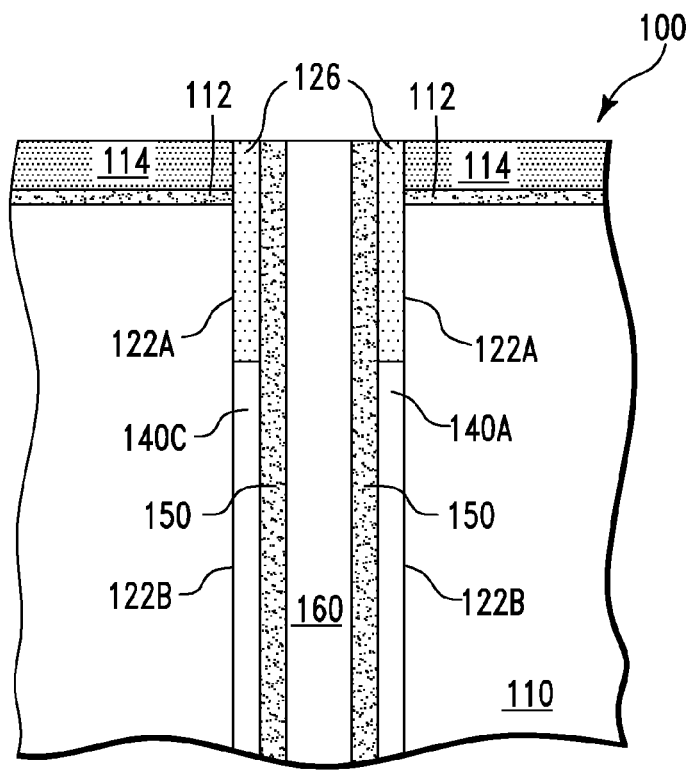
Figure 1H:
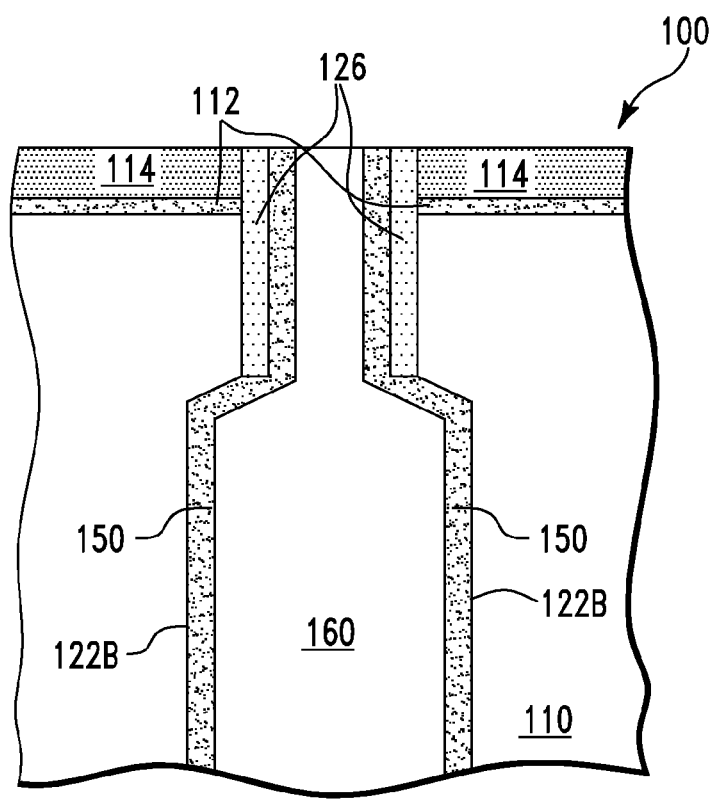

Next, in one embodiment, the fabrication process of the structure 100 further comprises a step of etching into the semiconductor substrate 110 selective to the four SiGe blocking regions 140a, 140b, 140c, and 140d, resulting in the structure 100 of FIG. 1H. As a result, the bottom trench portion 120B is expanded in the north, south, east, and west directions and not in the north-east, north-west, south-east, and south-west directions. This etching step is represented by arrows 144 and hereafter is referred to as an etching step 144. In one embodiment, the etching step 144 can be performed isotropically by using a mixture of nitric and hydrofluoric acid. Alternatively, the etching step 144 is a dry etching process such as plasma etch. Because the etching step 144 is isotropic and selective to the four SiGe blocking regions 140a, 140b, 140c, and 140d, therefore, only Si portions of the semiconductor substrate 110 on the $\{110\}$ side wall surfaces are removed.

Next, with reference to FIG. 1Ha, in one embodiment, a capacitor dielectric layer 150 is formed on the collar protection layer 126 and the sidewall 122B of bottom trench portion 120B. In one embodiment, the capacitor dielectric layer 150 comprises of an oxide, a nitride, an oxynitride, a high-k dielectric material such as hafnium oxide, or combination of these materials. In one embodiment, the capacitor dielectric layer 150 is formed by CVD (Chemical Vapor Deposition) or ALD (Atomic Layer Deposition).

Next, in one embodiment, the trench 120 is filled with a conducting material such as doped polysilicon so as to form one capacitor electrode 160 inside the trench 120. Illustratively, the capacitor electrode 160 is formed by depositing the doped polysilicon material on top of the entire structure 100 and inside the trench 120 and then planarized by a CMP (Chemical Mechanical Polishing) step to remove excessive polysilicon outside the trench 120. The substrate 110 surrounding the trench 120 acts as another electrode for the capacitor 110+150+160 (which includes the capacitor dielectric layer 150 and two capacitor electrodes 110 and 160).

FIGS. 1Hb and 1Hc illustrate cross-section views along lines 1Hb-1Hb and 1Hc-1Hc of the structure 100 of FIG. 1Ha. The capacitor 110+150+160 has the first capacitor electrode 160 and the second capacitor electrode 110, wherein the first and second capacitor electrodes 160 and 110 are electrically insulated from each other by the capacitor dielectric layer 150.

Figure 1I:
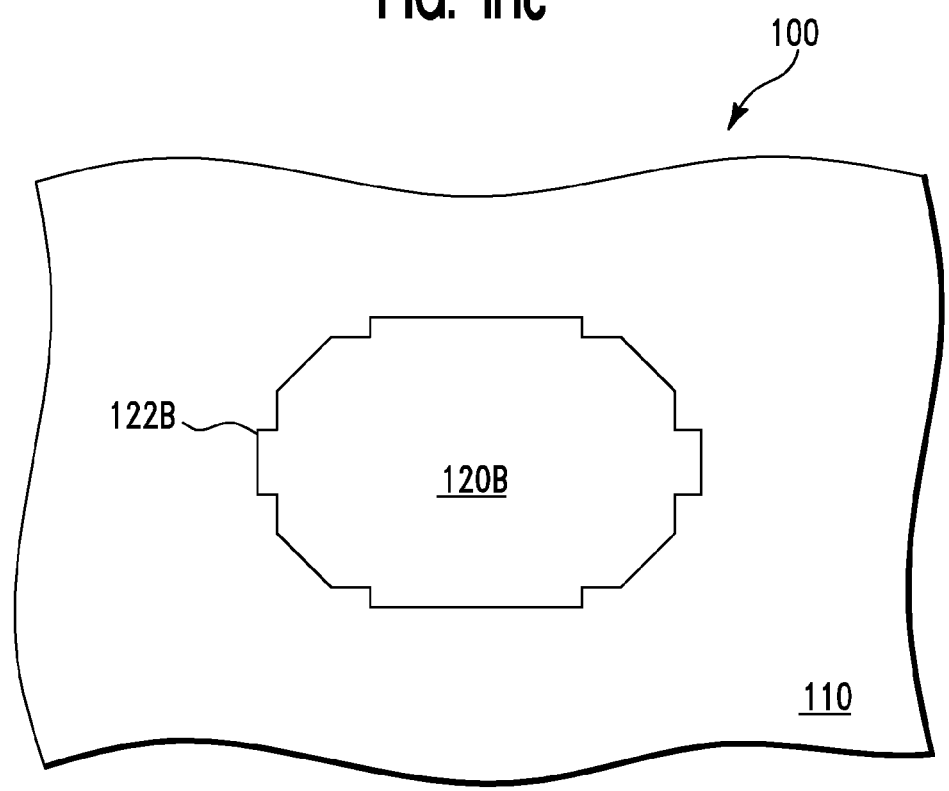
Figure 1L:
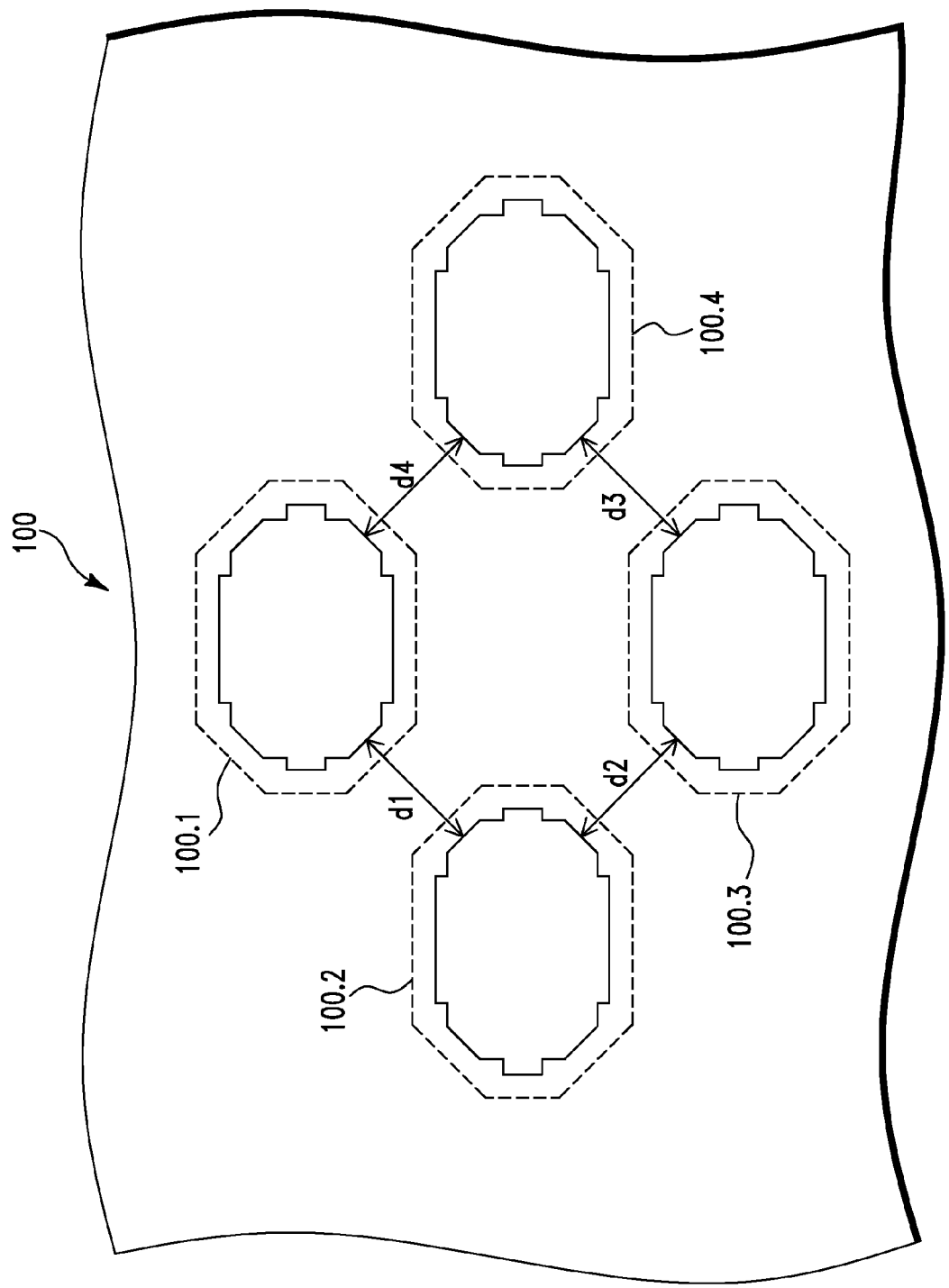

In an alternative embodiment, after the step as described in FIG. 1H, the four SiGe blocking regions 140a, 140b, 140c, and 140d are removed, resulting in the structure 100 of FIG. 1I. In one embodiment, the SiGe blocking regions 140a, 140b, 140c, and 140d are removed by performing an etching process essentially selective to the semiconductor substrate 110. In one embodiment, the etching process is a wet etching process with an etchant containing ammonia-based chemistry. Alternatively, the etching process is a dry etching process such as plasma etch.

Next, in one embodiment, the trench 120 can be used to form a capacitor (not shown) using the same process described above for forming the capacitor 110+150+160. It should be noted that the etching step 144 (in FIG. 1H) helps expand the bottom trench portion 120B, resulting in a greater capacitance of the later formed capacitor.

In the description above, for simplicity, with reference to FIGS. 1A-1I, the structure 100 comprises the only one trench 120. In general, the structure 100 can comprise multiple trenches similar to the trench 120 as described in FIGS. 1A-1I.

More specifically, with reference to FIG. 1Ia, the structure 100 comprises, illustratively, four bottom trench portions 100.1, 100.2, 100.3, and 100.4 of four trenches (not shown but similar to the trench 120 as described in FIGS. 1A-1I). In one embodiment, the four bottom trench portions 100.1, 100.2, 100.3, and 100.4 of the four trenches can be formed simultaneously using the fabrication process described above in FIGS. 1A-1I. It should be noted that only four bottom trench portions 100.1, 100.2, 100.3, and 100.4 of the four trenches are shown in FIG. 1Ia. In general, the structure 100 can have N bottom trench portions of the N trenches, wherein N is a positive integer.

As can be seen in FIG. 1Ia, there is room for expansion for each of the four bottom trench portions 100.1, 100.2, 100.3, and 100.4 in the north, south, east, and west directions without coming too close to the neighboring trenches. As a result, by expanding the four bottom trench portions 100.1, 100.2, 100.3, and 100.4 in the north, south, east, and west directions, the etching step 144 (in FIG. 1H) helps expand the four bottom trench portions 100.1, 100.2, 100.3, and 100.4 without bringing them too close to their neighbors. More specifically, during the etching step 144, distances d1 (between the bottom trench portions 100.1 and 100.2), d2 (between the bottom trench portions 100.2 and 100.3), d3 (between the bottom trench portions 100.3 and 100.4), and d4 (between the bottom trench portions 100.1 and 100.4) do not change.

Figure 2A:
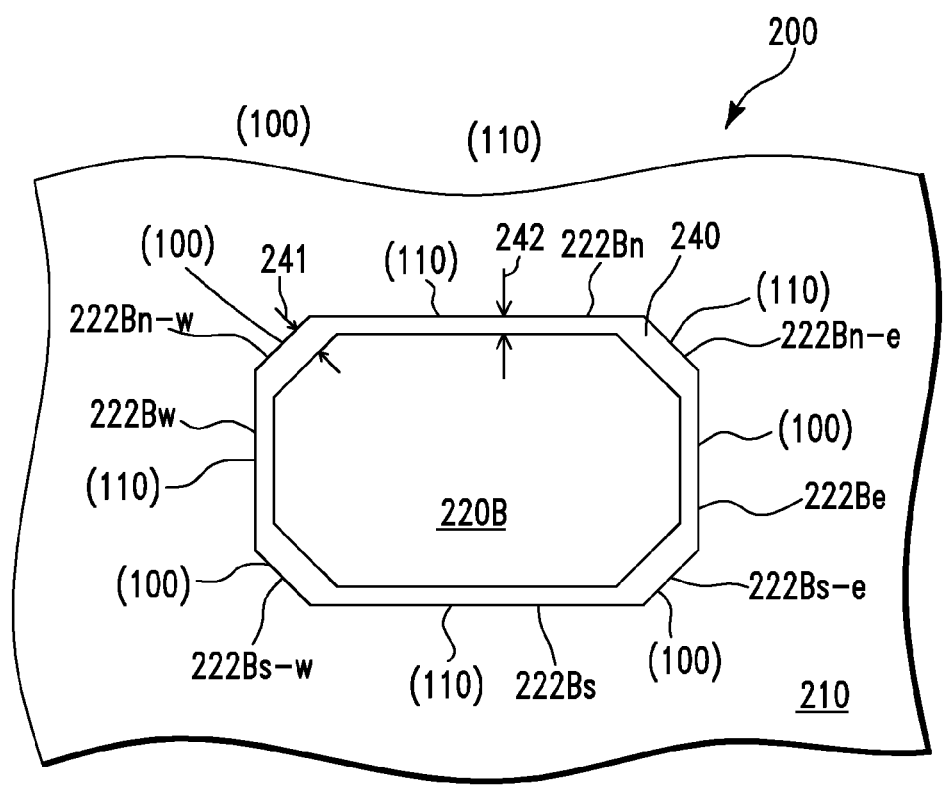
FIGS. 2A-2C illustrate a second fabrication method for forming a second semiconductor structure, in accordance with embodiments of the present invention.
Figure 2B:
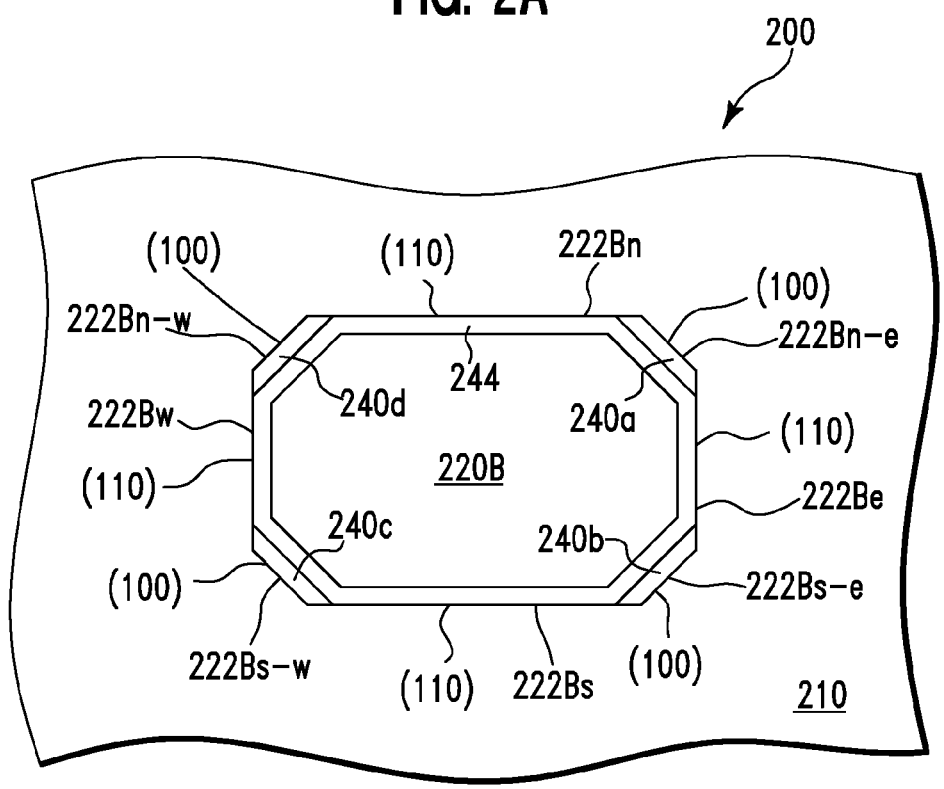
Figure 2C:
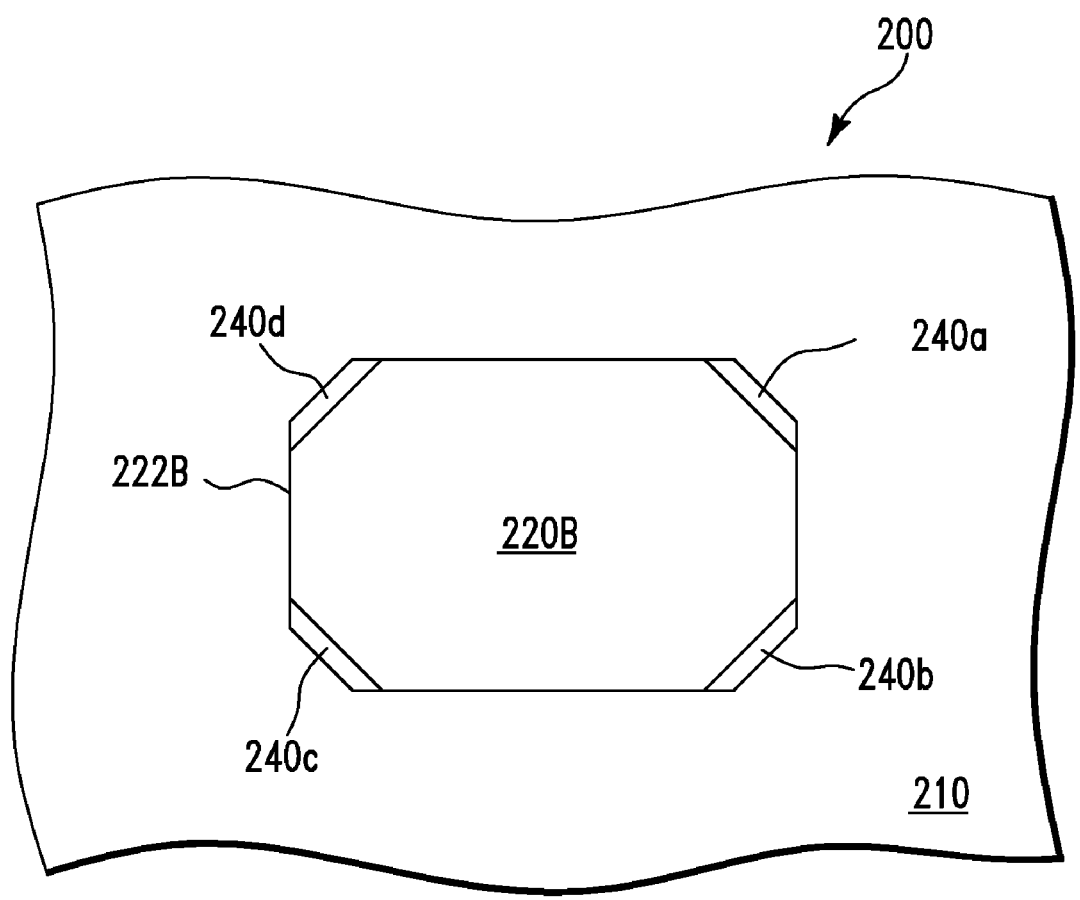

FIGS. 2A-2C illustrate a second fabrication method for forming a semiconductor structure 200, in accordance with embodiments of the present invention. More specifically, in one embodiment, the second fabrication method starts out with the structure 200 of FIG. 2A. In one embodiment, the structure 200 of FIG. 2A is similar to the structure 100 of FIG. 1F. Illustratively, the formation of the structure 200 of FIG. 2A is similar to the formation of the structure 100 of FIG. 1F. It should be noted that similar regions of the structure 200 of FIG. 2A and the structure 100 of FIG. 1F have the same reference numerals, except for the first digit, which is used to indicate the figure number. For instance, the SiGe layer 240 (FIG. 2A) and the SiGe layer 140 (FIG. 1F) are similar.

Next, with reference to FIG. 2B, in one embodiment, an oxide layer 244 is formed by thermally oxidizing the SiGe layer 240. In one embodiment, the step of thermally oxidizing the SiGe layer 240 is performed until SiGe regions on {110} side wall surfaces 232Be, 232Bw, 232Bn, and 232Bs of the SiGe layer 240 are completely oxidized. It should be noted that (i) the SiGe layer 240 is thicker on {100} side wall surfaces 232Bn-e, 232Bn-w, 232Bs-e, and 232Bs-w than on the {110} side wall surfaces 232Be, 232Bw, 232Bn, and 232Bs (as shown in FIG. 2A), and that (ii) the thermally oxidizing rate for the SiGe regions on the {110} side wall surfaces 232Be, 232Bw, 232Bn, and 232Bs is faster than the thermally oxidizing rate for SiGe regions on the {100} side wall surfaces 232Bn-e, 232Bn-w, 232Bs-e, and 232Bs-w. As a result, the entire SiGe material on the {110} side wall surfaces 232Be, 232Bw, 232Bn, and 232Bs is converted to oxide material 244, while leaving the four SiGe regions 240a, 240b, 240c, and 240d on the four {100} side wall surfaces 232Bn-e, 232Bs-e, 232Bs-w, and 232Bn-w, respectively, as shown in FIG. 2B.

Next, in one embodiment, the SiGe oxide layer 244 is removed by using an etching step, resulting in the structure 200 of FIG. 2C. In one embodiment, the etching step is performed as a wet etching step with an etchant containing hydrofluoric acid which removes the oxide layer 244 and is essentially selective to the four SiGe regions 240a, 240b, 240c, and 240d and the semiconductor substrate 210.

It should be noted that the structure 200 of FIG. 2C is similar to the structure 100 of FIG. 1G. After that, the fabrication process of the structure 200 is continued with the similar steps of FIGS. 1H-1I.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
   a semiconductor substrate;
   a trench in the semiconductor substrate,
      wherein the trench comprises a side wall, and
      wherein the side wall comprises {100} side wall surfaces and {110} side wall surfaces;
   blocking regions on the {100} side wall surfaces and not on the {110} side wall surfaces; and
   a dielectric layer on the side wall surfaces of the trench and in direct physical contact with the blocking regions.

2. The structure of claim 1, wherein the dielectric layer comprises an oxide material.

3. A semiconductor structure, comprising:
   (a) a semiconductor substrate which comprises a first semiconductor material;
   (b) an electrically conducting region in the semiconductor substrate;
   (c) a capacitor dielectric layer (i) sandwiched between, (ii) in direct physical contact with, and (iii) electrically insulating the electrically conducting region and the semiconductor substrate;
   (d) a semiconductor blocking region (i) sandwiched between and (ii) in direct physical contact with the capacitor dielectric layer and the semiconductor substrate,
      wherein the semiconductor blocking region comprises a second semiconductor material different from the first semiconductor material.

4. The structure of claim 3, wherein the semiconductor substrate, the electrically conducting region, and the capacitor dielectric layer form a capacitor.

5. The structure of claim 3,
   wherein the semiconductor substrate and the semiconductor blocking region share first interfacing surfaces,
   wherein the semiconductor substrate and the capacitor dielectric layer share second interfacing surfaces,
   wherein the semiconductor substrate has a first crystallographic orientation at the first interfacing surfaces,
   wherein the semiconductor substrate has a second crystallographic orientation at the second interfacing surfaces, and
   wherein the first crystallographic orientation is different from the second crystallographic orientation.

6. The structure of claim 3, wherein the semiconductor substrate comprises silicon.

7. The structure of claim 3, wherein the semiconductor blocking region comprises a mixture of silicon and germanium.

* * * * *